US00RE42117E

(19) United States
(12) Reissued Patent
Fossum et al.

(10) Patent Number: US RE42,117 E
(45) Date of Reissued Patent: *Feb. 8, 2011

(54) APPARATUS FOR OPERATING A CMOS IMAGER HAVING A PIPELINED ANALOG TO DIGITAL CONVERTER

(75) Inventors: Eric R. Fossum, Wolfeboro, NH (US); Sandor L. Barna, Pasadena, CA (US)

(73) Assignee: Round Rock Research, LLC, Mt. Kisco, NY (US)

( * ) Notice: This patent is subject to a terminal disclaimer.

(21) Appl. No.: 11/896,441

(22) Filed: Aug. 31, 2007

Related U.S. Patent Documents

Reissue of:
(64) Patent No.: 6,909,392
Issued: Jun. 21, 2005
Appl. No.: 10/694,759
Filed: Oct. 29, 2003

U.S. Applications:
(63) Continuation of application No. 10/061,938, filed on Oct. 25, 2001, now Pat. No. 6,646,583.
(60) Provisional application No. 60/243,324, filed on Oct. 25, 2000.

(51) Int. Cl.
*H03M 1/34* (2006.01)

(52) U.S. Cl. ..... 341/162; 341/120; 341/155; 341/124; 341/144

(58) Field of Classification Search ..... 341/120–170, 341/192
See application file for complete search history.

(56) References Cited

U.S. PATENT DOCUMENTS

| | | | | | |
|---|---|---|---|---|---|
| 4,366,469 | A | * | 12/1982 | Michaels et al. | 341/139 |
| 5,471,515 | A | | 11/1995 | Fossum et al. | |
| 5,801,657 | A | * | 9/1998 | Fowler et al. | 341/155 |
| 5,880,691 | A | * | 3/1999 | Fossum et al. | 341/162 |
| 5,886,659 | A | * | 3/1999 | Pain et al. | 341/155 |
| 5,920,274 | A | * | 7/1999 | Gowda et al. | 341/155 |
| 6,124,819 | A | * | 9/2000 | Zhou et al. | 341/155 |
| 6,377,303 | B2 | * | 4/2002 | O'Connor | 341/155 |
| 6,518,907 | B2 | | 2/2003 | Tsai | |
| 6,646,583 | B1 | * | 11/2003 | Fossum et al. | 341/144 |
| 6,734,817 | B2 | * | 5/2004 | Naka et al. | 341/155 |
| 6,771,202 | B2 | | 8/2004 | Watanabe et al. | |
| 7,283,080 | B2 | | 10/2007 | Kirsch | |
| 7,313,380 | B2 | * | 12/2007 | Yamaji | 455/264 |
| 2004/0041927 | A1 | | 3/2004 | Cho et al. | |
| 2007/0223626 | A1 | * | 9/2007 | Waxman | 375/316 |
| 2008/0218621 | A1 | | 9/2008 | Cho et al. | |

* cited by examiner

*Primary Examiner*—Lam T Mai
(74) *Attorney, Agent, or Firm*—Lerner, David, Littenberg, Krumholz & Mentlik, LLP

(57) ABSTRACT

[An image sensor system using offset analog to digital converters. The analog to digital converters require a plurality of clock cycles to carry out the actual conversion. These conversions are offset in time from one another, so that at each clock cycle, new data is available.] *Systems are disclosed in which an image sensor converts an analog signal into a digital signal using a pipelined analog to digital converter.*

17 Claims, 4 Drawing Sheets

APPARATUS FOR OPERATING A CMOS IMAGER HAVING A PIPELINED ANALOG TO DIGITAL CONVERTER

Matter enclosed in heavy brackets [ ] appears in the original patent but forms no part of this reissue specification; matter printed in italics indicates the additions made by reissue.

CROSS-REFERENCE TO RELATED APPLICATIONS

*Notice: More than one reissue application has been filed for the reissue of U.S. Pat. No. 6,909,392. The reissue applications are (1) reissue application Ser. No. 11/812,785 filed on Jun. 21, 2007, (2) Ser. No. 11/869,441 (the present application) filed on Aug. 31, 2007, and (3) Ser. No. 11/869,442 also filed on Aug. 31, 2007. The applications Ser. Nos. 11/869,441 and 11/869,442 are continuation of reissue application Ser. No. 11/812,785.*

This application is a continuation of application Ser. No. 10/061,938, filed Oct. 25, 2001 ([scheduled to issue as] U.S. Pat. No. 6,646,583, *which issued* on Nov. 11, 2003), which claims priority from provisional Application No. 60/243,324 filed Oct. 25, 2000. The subject matter of applications Ser. Nos. 10/061,938 and 60/243,324 *filed Oct. 25, 2000* are hereby incorporated by reference.

BACKGROUND

The basic operation of a CMOS active pixel sensor is described in U.S. Pat. No. [5,471,215] *5,471,515*. This kind of image sensor, and other similar image sensors, often operate by using an array of photoreceptors to convert light forming an image, into signals indicative of the light, e.g. charge based signals. Those signals are often analog, and may be converted to digital by an A/D converter. Image sensors which have greater numbers of elements in the image sensor array may produce more signals. In order to handle these signals, either more A/D converters must be provided, or the existing A/D converters need to digitize the data from these image sensors at higher signal rates. For example, a high precision CMOS active pixel sensor may require an A/D converter which is capable of 10 bits of resolution at 20 Megasamples per second.

Image sensors of this type are often limited by the available area or "real estate" on the chip, a and the available power for driving the chip. An advantage of using CMOS circuitry is that power consumption of such a circuit may be minimized. Therefore, the power consumption of such a circuit remains an important criteria. Also, since real estate on the chip may be limited, the number of A/D converters and their size should be minimized.

A/D converters with this kind of resolution, in the prior art, may have a power consumption of about 25 mw using a 3.3 volt power supply.

SUMMARY

*In accordance with one embodiment, a CMOS image sensor includes an analog to digital converter to convert successive analog signals, representing at least a portion of an image, into successive digital signals. Multiple clock cycles may be used by the converter to fully convert an analog signal into a corresponding digital signal. The conversion of one analog signal into a corresponding digital signal may be offset in time and partially overlapping with the conversion of a successive analog signal into its corresponding successive digital signal.*

The present application describes a system, and a special A/D converter using individual successive approximation A/D converter cells which operate in a pipelined fashion.

BRIEF DESCRIPTION OF THE DRAWINGS

These and other aspects will now be described in detail with reference to the accompanying drawings, wherein.

DETAILED DESCRIPTION

Figure 1:
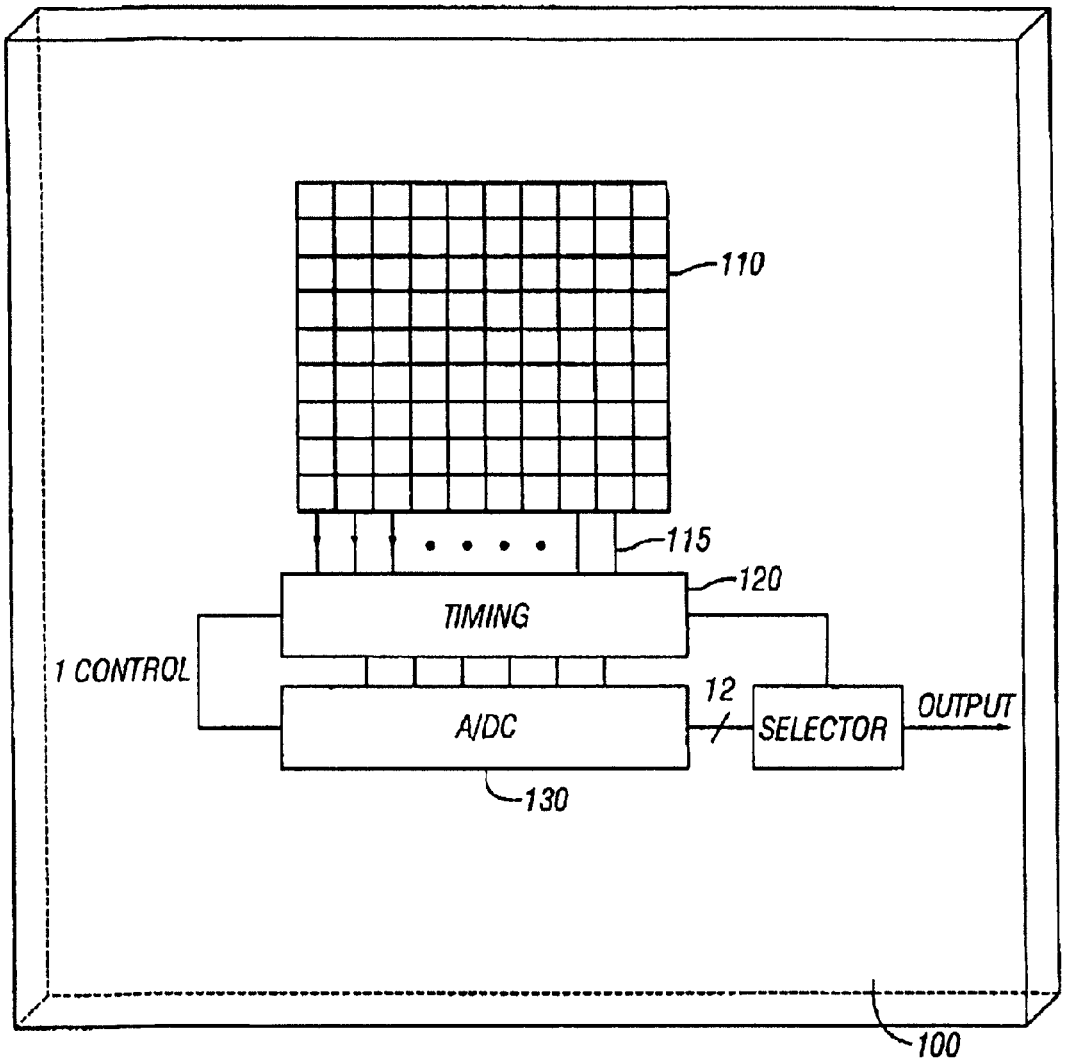
FIG. 1 shows a block diagram of a circuit on a chip including an image sensor and A/D converter.

According to the present system, a plurality of successive approximation A/D converter cells are provided. The embodiment recognizes that the pixel analog data is arriving at a relatively high rate, e.g. 20 Mhz. A plurality of A/D converters are provided, here twelve A/D converters are provided, each running at 1.6 megasamples per second. The timing of these A/D converters are staggered so that each A/D converter is ready for its pixel analog input at precisely the right time. The power consumption of such cells is relatively low; and therefore the power may be reduced.

In the embodiment, an A/D converter with 10 bits of resolution and 20 megasamples per second is provided that has a power consumption on the order of 1 mW. Twelve individual successive approximation A/D converter cells are provided. Each requires 600 ns to make each conversion. Since twelve stages are necessary, the total data throughput equals twelve/600 ns=20 megasamples per second. Each successive approximation A/D converter requires 12 complete clock cycles to convert the 10 bit data. The first clock cycle samples the input data, then 10 clock cycles are used to convert each of the bits. A single clock cycle is used for data readout.

A block diagram is shown in FIG. 1. FIG. 1 shows how a single chip substrate 100 includes a photo sensor array 110. Photosensor array 110 can be an array of, for example, photodiodes, photogates, or any other type of photoreceptors. The output 115 of the array 110 is coupled to a timing circuit 120 which arranges the data to be sent to the A/D converter array 130. The data is sent such that each A/D converter receives data at a different, staggered time.

Figure 2:
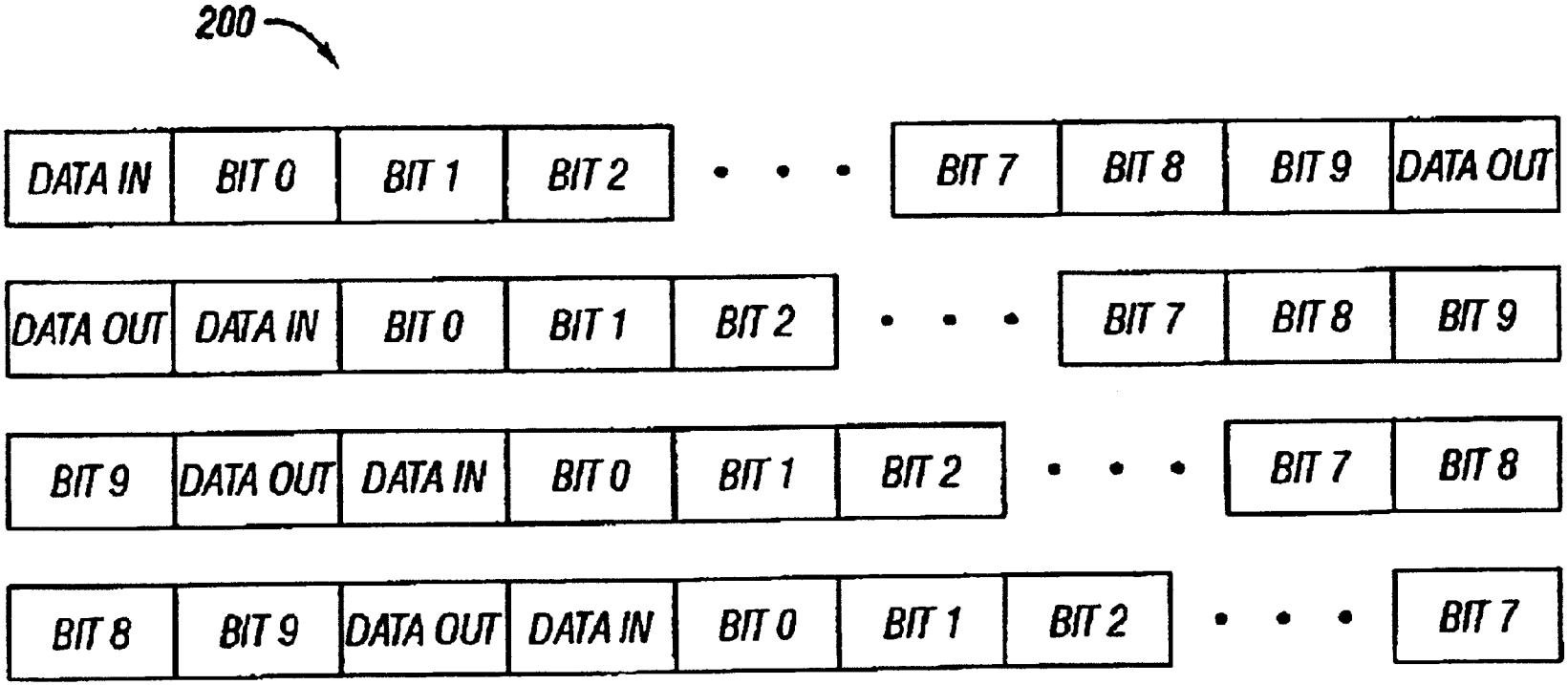
FIG. 2 shows relative timing of A/D converter cells.

FIG. 2 shows how the timing and switching of the data is carried out. The input signals from the image sensor array 110 are staggered and provided to the A/D converters at different times, preferably one clock cycle apart. FIG. 2 shows the relative timing of four of the twelve A/D converter cells. The first row 200 for example may represent the first A/D converter. Data that is input during cycle No. 1 is available at the output of the A/D converter during cycle No. 12. Different data from different ones of the converters are output in each cycle.

Figure 3:
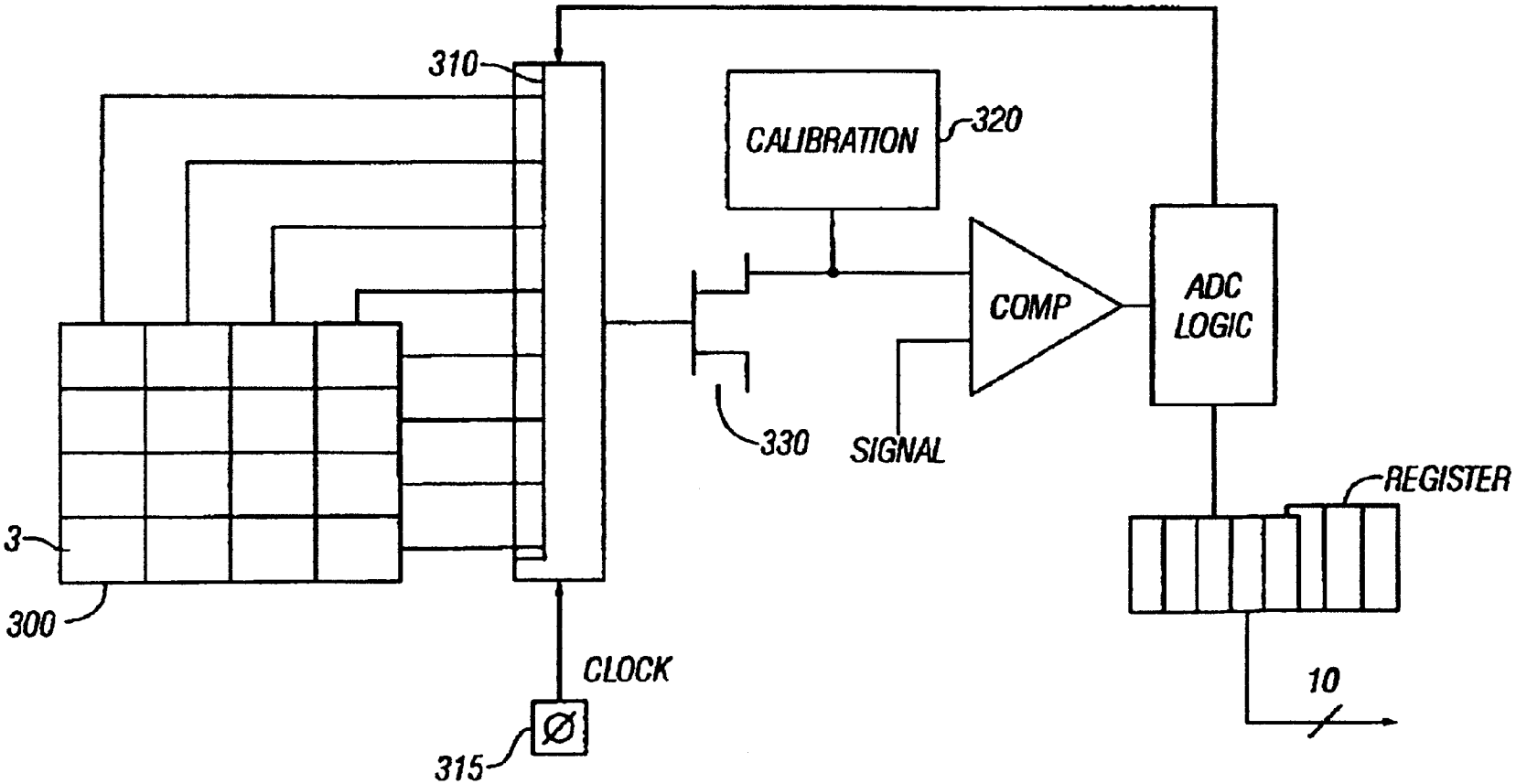
FIG. 3 shows an embodiment with built-in calibration in the system.

FIG. 3 shows a block diagram of each of the twelve A/D converter elements. The elements may operate using capacitors formed by a capacitor array 300. In this embodiment, unit cell capacitors are formed. The capacitor array 300 is formed, for example, of N different elements, each of which are identical. Matching each of these capacitors may ensure linearity. A switching element 310 may switch the capacitor combinations in the proper way to convert a specific bit. As conventional in a successive approximation A/D converter, different bits are obtained and output during different clock cycles. Hence the clock input at 315 may select the different bits which are used and may hence select the number of the capacitor elements which are used.

This system may adaptively assign the channels to A/D converters in a different way than conventional. Conventional methods of removing fixed patterned noise, therefore, might not be as effective. Therefore, it becomes important that these A/D converters have consistent characteristics. In this embodiment, calibration may be used to compensate for offsets between the comparators of the system.

Successive approximation A/D converters as used herein may have built-in calibration shown as elements 320. Any type of internal calibration system may be used.

The inventors also realize that comparator kickback noise may become a problem within this system. That comparator itself may produce noise which may affect the signal being processed. In this embodiment, a single preamplifier, here shown as a follower 330, is introduced between the signal and the comparator.

This system also requires generation of multiple timing and control signals to maintain the synchronization. Each successive approximation A/D converter requires about 20 control signals. The timing is offset for each of the twelve different A/D converters. Therefore, digital logic is used to replicate control signals after a delay.

Figure 4A:
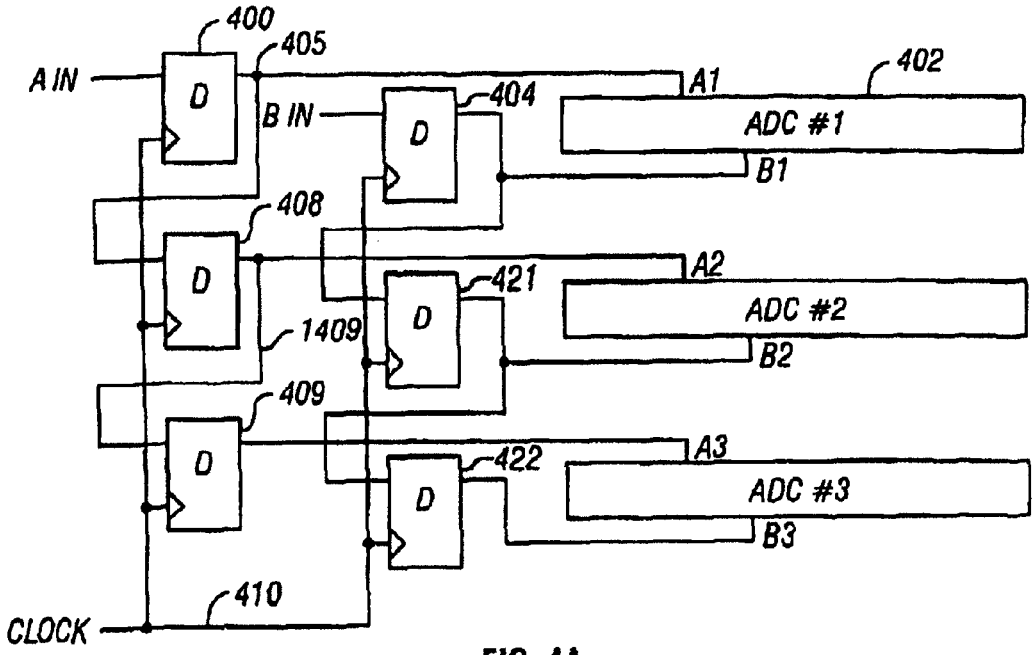
FIGS. 4A and 4B show two alternative schemes for implementing the A/D converter timing and control.

In one embodiment, shown in FIG. 4A, a plurality of flip-flops, here D type flip-flops, are used to delay the respective signals. In FIG. 4A, the control signals showed as A in and B in are separately delayed using a series of flip-flops; with A in delayed by flip-flops 400, 408, 409; and B in delayed by flip-flops 404, 421, 422. For example, the control signal A in is delayed by flip-flop 400 to produce signal A1, line 405, which is the first control signal for the first A/D converter 402. Similarly, the B in control signal is delayed by flip-flop 404 to produce the B1 control signal for the A/D converter 402. The A1 signal 405 also drives the input of the second D flip-flop 408. The output of flip-flop 408 similarly drives flip-flop 409 and the like. Each successive output such as 405 is then delayed by the next flip-flop 408, and used as the respective second control (here A2, B2) for the A/D converters.

Each cycle of the A/D converter may require finer timing than can be offered by a usual clock. Hence, the clock input 410 may be a divided higher speed clock.

Two D type flip-flops are required to delay each signal. Any signal which is only half a clock cycle in length may require falling edge flip-flops, in addition to the rising edge flip-flops, and may also require additional logic.

Figure 4B:
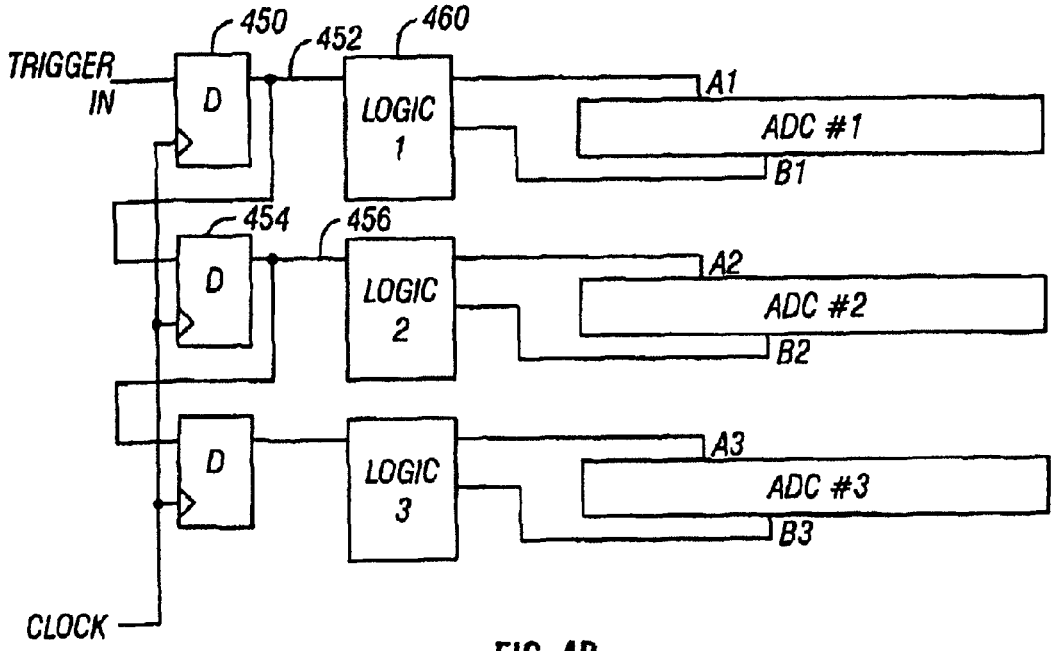

FIG. 4B shows an A/D converter cell with a trigger signal that is staggered by one or two flip-flops according to the master clocks. All of the local control signals may be generated locally within the A/D converter. Delayed versions of the clock are still obtained. For example, the D type flip-flops 450 produces a delayed version 452. Delayed version 452 triggers the next the flip-flop 454 to produce delayed version 456. Each of the delayed versions, such as 452, is further processed by the logic block 460. Logic block for 60 outputs the two control signals A1 and B1. For example, the control signal A1 may be output directly, with control signal B1 being delayed by a series of logic gates or transistors. Since this system uses fewer flip-flops, and only a single input signal, it may allow for improved symmetry between the A/D converters.

Although only a few embodiments have been disclosed in detail above, other modifications are possible. For example, different logic techniques may be used herein. In addition, while the above describes specific numbers of bits, the same techniques are applicable to other numbers of elements. For example, this system may be used with as few as three elements, with the three successive approximation devices staggered to receive one out of every three inputs.

The above has described matched unit cell capacitors, but it should also be understood that other capacitors could be used. Conventional capacitors which are not matched in this way can be used. In addition, the capacitors can be scaled relative to one another by some amount, e.g. in powers of two.

All such modifications are intended to be used within the following claims.

What is claimed is:

[1. An analog-to-digital (A/D) converter, comprising:

an input, for receiving a series of analog signals;

an output, for outputting a series of digital signals respectively corresponding to said series of analog signals;

a plurality of A/D cells, each of said A/D cells for converting one of said series of analog signals to a corresponding one of said series of digital signals; and a control circuit, coupled to said input, said output, and said plurality of A/D cells;

wherein said control circuit operates said input, said output, and said plurality of A/D cells so that each successive A/D cell is assigned, at a different time, to convert a different one of each successive analog signal from said series of analog signals to a corresponding digital signal in said series of digital signals.]

[2. The analog-to-digital converter of claim 1, wherein said different time correspond to a different period of a clock signal provided to said analog-to-digital converter.]

[3. The analog-to-digital converter of claim 1, wherein each of said A/D cells further comprises a calibration element, said calibration element being set so that each A/D cell coverts the same analog signal present at said input to a same digital value at said output.]

[4. The analog-to-digital converter of claim 1, wherein each of said A/D cells further comprises a noise suppression element.]

[5. The analog-to-digital converter of claim 4, wherein said noise suppression element comprises a transistor.]

[6. The analog-to-digital converter of claim 1, wherein each A/D cell performs an A/D conversion in a same amount of time.]

[7. The analog-to-digital converter of claim 1, wherein each A/D cell performs an A/D conversion using successive approximation.]

[8. The analog-to-digital converter of claim 1, wherein said control circuit operates to cause said analog-to-digital converter to begin converting a different one of said series of analog signals on each of a series of successive clock signals.]

[9. The analog-to-digital converter of claim 1, wherein said control circuit operates to cause said analog-to-digital converter to output a series of digital signals on each of a series of successive clock signals.]

[10. A method for converting a series of analog signals to a corresponding series of digital signals, comprising:

receiving over a period of time, a series of analog signals;

assigning each analog signal from said series of analog signals as they are received to an available A/D cell for analog-to-digital conversion to a corresponding digital signal; and outputting a different digital signal corresponding to a respective analog signal from said series of analog signals as each A/D cell finishes its analog-to-digital conversion;

wherein at least two A/D cells are performing respective analog-to-digital conversions while another A/D cell outputs one of said digital signals.]

[11. The method of claim 10, further comprising:

calibrating each A/D cell so that an analog-to-digital conversion performed on a same analog signal by any A/D cell results in a same digital signal.]

[12. The method of claim 10, wherein said step of assigning comprises a step of suppressing comparator kickback noise during said analog-to-digital conversion.]

[13. The method of claim 10, wherein each A/D cell performs an analog-to-digital conversion in a same amount of time.]

[14. The method of claim 10, wherein each A/D cell perform an analog-to-digital conversion using successive approximation.]

*15. A system comprising:*

*an input to receive light that forms an image;*

*an array of photoreceptors of a CMOS active pixel sensor to convert the image into a plurality of successive analog signals;*

*an analog to digital (A/D) converter comprising a plurality of successive approximation A/D converter cells; and*

*a controller to assign each of the plurality of successive analog signals to the A/D converter, wherein the A/D converter is configured to convert each of the plurality of successive analog signals to a respective each of a plurality of successive digital signals during time periods that are offset and partially overlapping.*

*16. The system of claim 15, wherein each of the plurality of successive analog signals represents a respective pixel of the image.*

*17. The system of claim 16, wherein the A/D converter is disposed on the same chip as the photoreceptors.*

*18. The system of claim 17, wherein each of the time periods are offset by one clock cycle.*

*19. The system of claim 15, wherein the A/D converter is disposed on the same chip as the photoreceptors, and the photoreceptors are photodiodes.*

*20. A camera having a lens to receive and focus light, the camera further comprising:*

*an array of photoreceptors of a CMOS active pixel sensor to convert the focused light into a plurality of successive analog signals;*

*an analog to digital (A/D) converter comprising a plurality of A/D converter cells; and*

*a controller to assign a respective analog signal of the plurality of successive analog signals to the A/D converter at staggered times that are offset from each other, wherein the A/D converter is configured to convert each respective analog signal of the plurality of successive analog signals to a respective digital signal during time periods that are at least partially overlapping.*

*21. The camera of claim 20, wherein the respective digital signal comprises at least a respective first bit.*

*22. The camera of claim 21, wherein the respective digital signal comprises ten bits.*

*23. The camera of claim 20, wherein each of the plurality of A/D converter cells is a successive approximation A/D converter cell.*

*24. The camera of claim 23, wherein the staggered times are offset by one clock cycle.*

*25. The camera of claim 20, wherein the staggered times are offset by one clock cycle.*

*26. A system comprising:*

*an apparatus to receive light and to form an image therefrom;*

*an array of pixels disposed on a semiconductor substrate to generate electrical signals associated with the image;*

*an input to an analog to digital (A/D) conversion unit to receive a plurality of analog signals associated with the image; and*

*an output from the A/D conversion unit to provide a plurality of digital signals corresponding to the analog signals during a second period of time after the first period of time, wherein between the first and second periods of time the A/D conversion unit is to contain different numbers of bits of respective portions of the digital signals corresponding to the analog signals in different states of conversion.*

*27. The system of claim 26, wherein the plurality of digital signals comprises at least three digital signals corresponding to at least three respective analog signals.*

*28. The system of claim 27, further comprising an amplifier to amplify the plurality of analog signals before the analog signals are to be received by the A/D conversion unit.*

*29. The system of claim 26, further comprising an amplifier to amplify the plurality of analog signals before the analog signals are to be received by the A/D conversion unit.*

*30. A system comprising:*

*a conversion circuit comprising a pixel array disposed on a semiconductor substrate and oriented to receive light associated with an image, the conversion circuit configured to convert the light into successive analog signals;*

*a gain circuit, disposed on the substrate, coupled to the conversion circuit to receive the successive analog signals from the conversion circuit and to amplify the successiive analog signals; and*

*an analog to digital (A/D) conversion circuit, disposed on the substrate, coupled to the gain circuit to receive the successive analog signals from the gain circuit during a first time period and to convert the successive analog signals into corresponding successive digital signals, wherein the A/D conversion circuit is to determine at least some bits of the corresponding successive digital signals during a second time period that begins after the first time period ends.*

*31. The system of the claim 30, wherein the successive analog signals comprises at least three analog signals.*

* * * * *

UNITED STATES PATENT AND TRADEMARK OFFICE

CERTIFICATE OF CORRECTION

PATENT NO. : RE42,117 E
APPLICATION NO. : 11/896441
DATED : February 8, 2011
INVENTOR(S) : Eric R. Fossum et al.

It is certified that error appears in the above-identified patent and that said Letters Patent is hereby corrected as shown below:

Column 1, line 25, delete the words "*filed Oct. 25, 2000*".
Column 5, line 24, delete the words "*successive approximation*".
Column 5, line 38, "are offset" should read --is offset--.
Column 6, line 56, "signals comprises" should read --signals comprise--.

Signed and Sealed this
Twenty-eighth Day of February, 2012

David J. Kappos

David J. Kappos
*Director of the United States Patent and Trademark Office*